(12) United States Patent
Ding et al.

(10) Patent No.: US 10,612,140 B2
(45) Date of Patent: Apr. 7, 2020

(54) METHOD AND CORRESPONDING REACTOR FOR PREPARING METAL NITRIDES WITH ADJUSTABLE METAL CONTENTS

(71) Applicant: Fudan University, Shanghai (CN)

(72) Inventors: Shijin Ding, Shanghai (CN); Yongping Wang, Shanghai (CN); Anan Zuo, Shanghai (CN); Wei Zhang, Shanghai (CN)

(73) Assignee: Fudan University, Shanghai (CN)

(*) Notice: Subject to any disclaimer, the term of this patent is extended or adjusted under 35 U.S.C. 154(b) by 0 days.

(21) Appl. No.: 15/747,007

(22) PCT Filed: May 18, 2017

(86) PCT No.: PCT/CN2017/084859
§ 371 (c)(1),
(2) Date: Jan. 23, 2018

(87) PCT Pub. No.: WO2018/133269
PCT Pub. Date: Jul. 26, 2018

(65) Prior Publication Data
US 2019/0330737 A1 Oct. 31, 2019

(30) Foreign Application Priority Data
Jan. 17, 2017 (CN) .......................... 2017 1 0035543

(51) Int. Cl.
*C23C 16/455* (2006.01)
*C23C 16/34* (2006.01)
(Continued)

(52) U.S. Cl.
CPC ........ *C23C 16/45536* (2013.01); *C23C 16/34* (2013.01); *C23C 16/45553* (2013.01); *H01L 21/28562* (2013.01); *H01L 21/76841* (2013.01)

(58) Field of Classification Search
CPC .............. C23C 16/45536; C23C 16/34; C23C 16/45553; H01L 21/28562; H01L 21/76841
See application file for complete search history.

(56) References Cited

U.S. PATENT DOCUMENTS

| | | | |
|---|---|---|---|
| 2003/0124457 A1* | 7/2003 | Jung | C07F 1/005 430/270.1 |
| 2014/0273452 A1* | 9/2014 | Blomberg | H01L 21/28562 438/680 |

* cited by examiner

*Primary Examiner* — Timor Karimy
(74) *Attorney, Agent, or Firm* — Amster, Rothstein & Ebenstein LLP

(57) ABSTRACT

A method and corresponding reactor for depositing metal-nitride thin film with adjustable metal contents. The method includes several first and second half reaction process. By adjusting the ratio of first and second half reaction cycles, metal nitride thin films with different metal contents can be grown. The first half reaction process is the decomposition of metal-organic precursor adsorbed on the substrate surface, leaving behind metal atom layer by light irradiation. The second half reaction process forms metal nitride thin films by the reaction of $NH_3$ plasma and the metal atomic layer on the substrate surface. This method can control the ratio between metal and nitrogen atom content in the film, thus achieving the regulation of film resistivity. In addition, this method offers favorable film step coverage and accurate film thickness control capability, which is significantly applicable for the film meeting the requirement of advanced CMOS integrated circuit technology.

7 Claims, 4 Drawing Sheets

(51) Int. Cl.
*H01L 21/285* (2006.01)
*H01L 21/768* (2006.01)

METHOD AND CORRESPONDING REACTOR FOR PREPARING METAL NITRIDES WITH ADJUSTABLE METAL CONTENTS

This application is a National Stage entry under 35 U.S.C. 371 of International Patent Application No. PCT/CN2017/084859, filed on May 18, 2017, which claims the benefit of and priority to Chinese Patent Application No. CN 201710035543.0, filed on Jan. 17, 2017, the entire contents of each of which are incorporated by reference herein.

FIELD OF THE DISCLOSURE

The present invention relates to the field of integrated circuit fabrication, and involves a method for depositing metal nitride film with adjustable metal contents. In terms of the preparation of a diffusion barrier layer in copper (Cu) interconnect technology and metal gate in field effect transistors, pulsing light assisted atomic layer deposition (ALD) technology is proposed, which can realize the growth of metal nitride, such as $Ta_xN_y$, $Ti_xN_y$, $Hf_xN_y$, and $W_xN_y$ with adjustable metal concentration.

BACKGROUND

Copper (Cu) interconnect technology is one of the most critical technologies in modern CMOS integrated circuits. However, copper is readily diffused into silicon and other dielectric materials. This will result in the failure of an integrated circuit if no effective isolation is imposed. It is reported that metal nitrides (such as $Ta_xN_y$, $Ti_xN_y$, and $W_xN_y$) take advantage of not only favorable copper anti-diffusion performance, but also good conductance and adhesion with low k dielectrics like SiOC, which make them preferred diffusion barrier materials in a copper interconnect process. In addition, these metal nitrides are also applicable for gate materials in MOSFET, which offers an optimal way for the integration between a high k dielectric and a metal gate. Furthermore, metal nitrides can also serve as electrode materials of metal-insulator-metal capacitors in RF integrated circuits.

Traditionally, the methods for preparing metal nitrides include physical vapor deposition (PVD) and chemical vapor deposition (CVD). Nevertheless, with the constant scale down of critical size, enlargement of device integration density, and shrinking of the distance between devices in integrated circuits, three dimensional structures have become the mainstream and the aspect ratio of vias in backend interconnect process is continuously increased. All these changes pose rigorous challenges such that traditional PVD and CVD technologies fail to meet the requirements of integrated circuits development, i.e., achieve the growth of ultrathin metal nitride films, the filling of high aspect ratio trenches, the formation of highly conformal coverage, and favorable uniformity for a large area. For example, 100% step coverage can be achieved for CVD only when the trench aspect ratio is below 10:1 and only 50% step coverage can be obtained for PVD under the same conditions. Additionally, it is difficult to ensure the growth of ultrathin metal nitride film and the uniformity of a large area for a CVD process. In contrast, ALD can achieve the above requirements. For example, metal nitride films can be deposited by the reaction of a metal-organic precursor with $NH_3$ plasma. However, based on the ALD growth theory, metal and nitrogen atoms are alternatively produced, i.e., metal and nitrogen atom ratio is stable in the film. As a consequence, the relative metal and nitrogen atom ratio cannot be modulated and especially the relative percentage content of metal atoms cannot be enhanced, which restrains the achievement of metal nitrides with lower resistivity.

From the above description, a new kind of manufacturing process is essential to be developed for the preparation of metal nitrides with adjustable metal contents.

SUMMARY

This invention aims at providing a method for preparing metal nitrides with adjustable metal contents. i.e., a pulsing light assisted ALD process, which can provoke the decomposition of ligands in metal-organic precursors to achieve the accumulation growth of metal atom layers with the help of light irradiation and realize the growth of nitrogen atom layers, followed by the bonding with metal atoms by traditional ALD process. Metal nitrides with adjustable metal contents, i.e., controllable film resistivity, can be deposited by modulating the cycles of pulsing light assisted growth.

In order to accomplish the above objective, this present invention proposes a method for preparing metal nitrides with adjustable metal contents. This method includes several first and second half reaction processes. By adjusting the ratio of first and second half reaction cycles, metal nitride thin films with different metal contents can be grown. The first half reaction process is the decomposition of metal-organic precursor adsorbed on the substrate surface, leaving behind metal atom layer, by light irradiation. The second half reaction process aims at forming metal nitride thin films by the reaction of $NH_3$ plasma and metal atomic layer on the substrate surface.

The said metal is selected from one or the mixture in the group consisting of Tantalum (Ta), Titanium (Ti), Hafnium (Hf), Tungsten (W), and Molybdenum (Mo).

Preferably, metal nitride thin film is deposited by light irradiation assisted atomic layer deposition in this method.

Preferably, metal nitride thin film is grown in an ALD reactor with a light source.

The ALD reactor comprises the reaction chamber and the light source. The light source is over the reaction chamber.

The first half reaction includes the following steps:

Step 1, introduce metal-organic precursors into the reaction chamber with a substrate by way of a pulse, enabling the precursor adsorbed on the substrate surface to react with surface active ligands to saturation;

Step 2, introduce inert gas into the reaction chamber in order to remove excess metal precursors and reaction byproducts in the chamber;

Step 3, switch on the light source to irradiate the substrate and the metal-organic precursors decompose into metal atoms and gaseous organic ligand molecules, wherein the gaseous organic ligand molecules leave off the substrate surface and the metal atoms are attached to the substrate surface; and Step 4, introduce inert gas into the reaction chamber to remove the gaseous organic ligand molecules.

The reaction chamber is heated to 100-300° C. prior to Step 1.

The second half reaction includes the following steps:

Step 5, introduce $NH_3$ into the reaction chamber and meanwhile switch on the plasma generator to produce $NH_3$ plasma, followed by the reaction of $NH_3$ plasma with metal atoms on the substrate surface, thus forming metal nitride; and Step 6, introduce inert gas into the reaction chamber to remove excess NH$_3$ plasma and reaction byproducts in the chamber.

This method takes advantages of a pulsing light assisted ALD process, which can provoke the decomposition of ligands in metal-organic precursors to achieve the accumulation growth of metal atom layers with the help of light irradiation and realize the growth of nitrogen atom layers, followed by the bonding with metal atoms by a traditional ALD process. Metal nitrides with adjustable metal contents, i.e., controllable film resistivity, can be deposited by modulating the cycles of pulsing light assisted growth.

This method also provides a kind of ALD reactor applicable for the aforementioned method for preparing metal nitrides with adjustable metal contents. This ALD reactor comprises the ALD reaction chamber and a light source, wherein the light source for light irradiation is over the ALD reaction chamber. Preferably, the light source is a source of ultraviolet light or infrared light.

The advantages of this invention:

1) The method of this invention for preparing metal nitrides can not only adjust the metal and nitrogen atom ratio, but also modulate the film resistivity.

2) The method of this invention is compatible with traditional ALD process. As a result, this method offers favorable film step coverage and accurate film thickness control capability, which is significantly applicable for the film filling in the trench with high aspect ratio and can meet the requirement of advanced CMOS integrated circuit technology.

3) The method of this invention can effectively invoke the decomposition of the ligands in metal-organic precursors by light irradiation. The light irradiation is less damaging to the substrate and will not introduce impurities (generally from the ligands) to the film, which improves the film conductance and extensibility effectively.

DESCRIPTION OF THE SPECIFIC EMBODIMENTS

The following is the further description of this invention by detailed embodiments with attached drawings (deposit Ta$_x$N$_y$). The exemplary embodiments serve to describe the invention, and are not limitations to the scope of the claimed invention.

Figure 1:
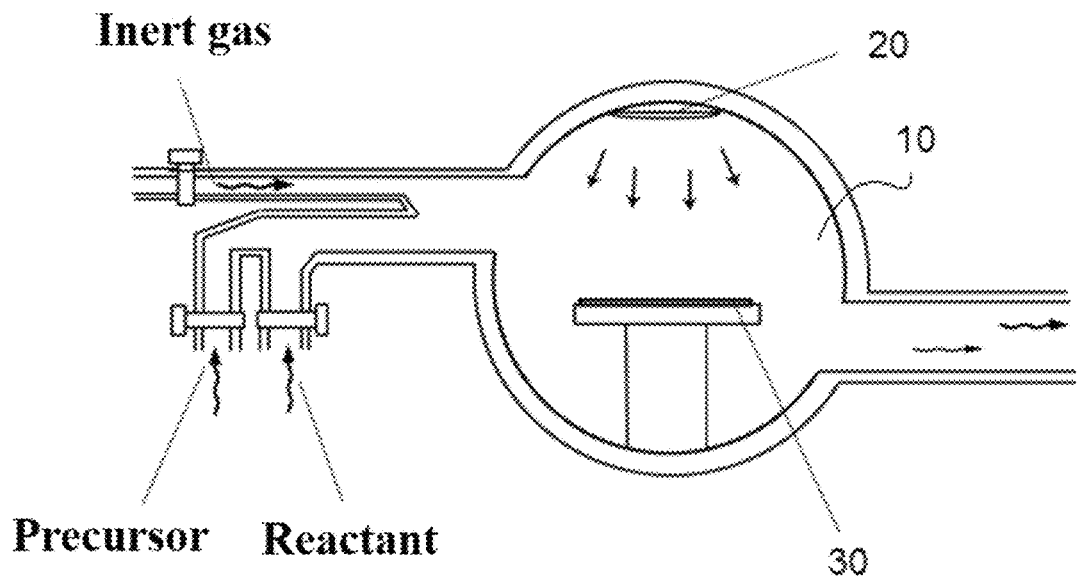
FIG. 1 is the schematic graph of the reaction chamber in the ALD reactor with light source.

FIG. 1 is the schematic graph of the reaction chamber in the ALD reactor with light source. This ALD reactor consists of the reaction chamber 10 and light source 20. The light source 20 is over the reaction chamber 10. P type (100) single crystalline silicon is placed into the reaction chamber 10 as the substrate 30 for preparing Ta$_x$N$_y$ films. Then the substrate 30 is heated to target temperature for depositing Ta$_x$N$_y$ films.

In order to enable the precursor, Tantalum Pentakis (dimethylamide) (PDMAT), to produce enough vapor pressure, the container with PDMAT needs to be heated, and the preferred temperature is 120° C. In case the Ta precursor is condensed during transport, its transport pipe is also heated to 130° C.

Figure 2:
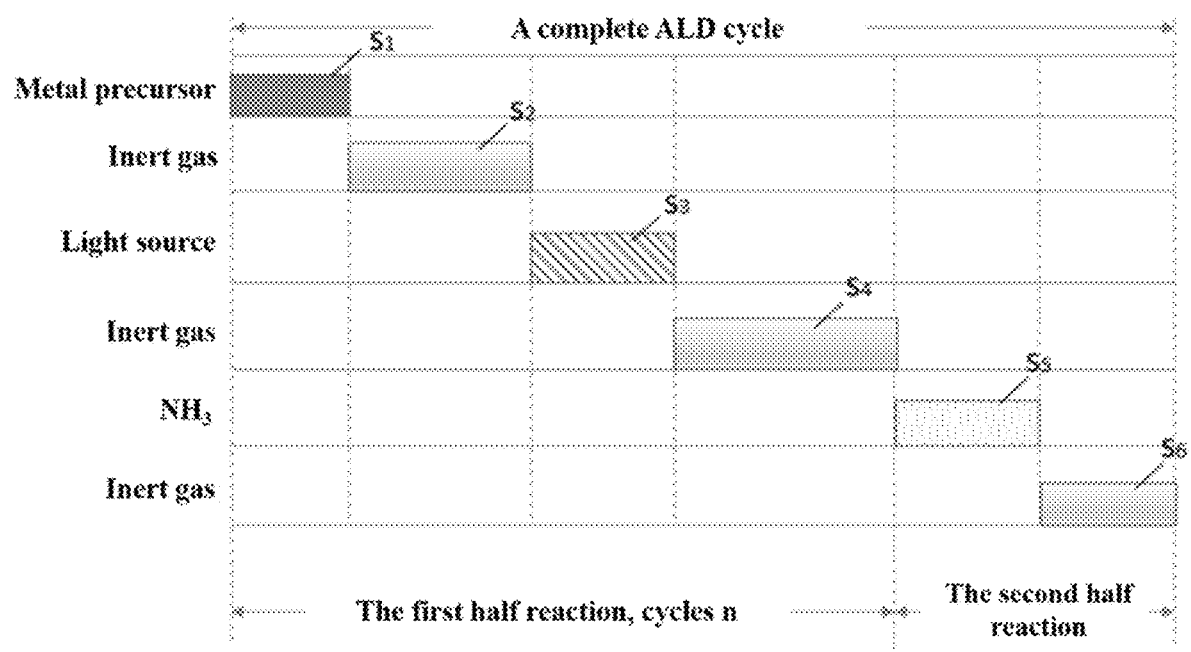
FIG. 2 is the schematic graph of the reaction cycling for preparing metal nitride films with adjustable metal contents.
Figure 3A:
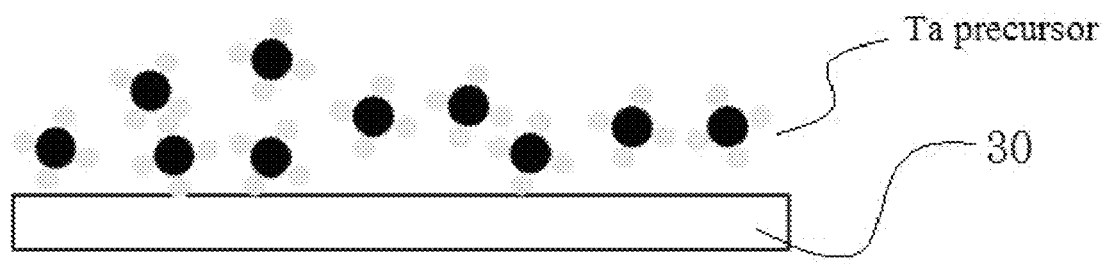
FIGS. 3a-3e are the schematic graphs of the first half reaction process (produce Ta atom layers) of ALD Ta$_x$N$_y$ films with the help of a light source.

FIG. 2 is the schematic graph of a complete growth cycle for preparing Ta$_x$N$_y$ films, including the first half reaction for the decomposition of the metal-organic ligands with the help of light irradiation and the second half reaction for the nitridation by generating NH$_3$ plasma. The first half reaction includes the following steps:

Step 1 (S1), introduce the Ta precursor PDMAT into the reaction chamber and keep the precursor in the chamber for a duration, enabling the Ta precursor adsorbed on the substrate surface to react with surface active ligands, as shown in FIG. 3a.

Figure 3B:
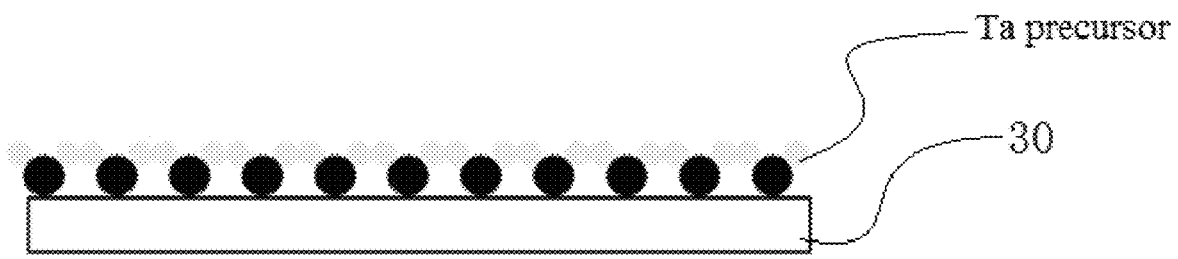

Step 2 (S2), introduce inert gas N$_2$ into the reaction chamber to purge the Ta precursors not adsorbed on the substrate surface, leaving behind a single layer of Ta precursors adsorbed on the substrate surface to saturation, as shown in FIG. 3b.

Figure 3C:
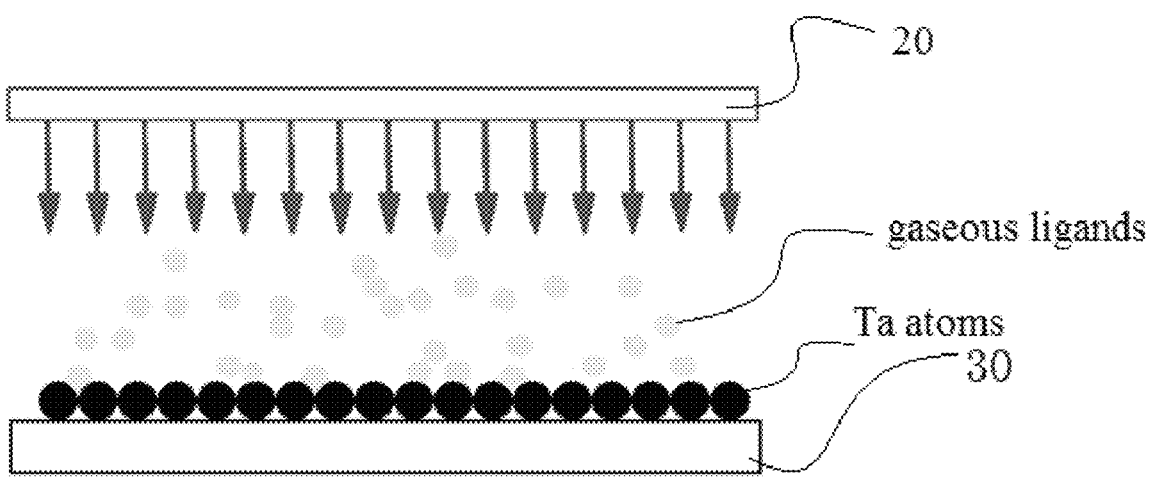

Step 3 (S3), switch on the light source to irradiate the Ta precursors on the substrate surface, and the chemical bonds between metal and ligands break down, i.e., the Ta precursors adsorbed on the substrate surface decompose to Ta atoms (attached on the substrate surface) and gaseous ligands (left off the substrate surface), as shown in FIG. 3c.

Figure 3D:
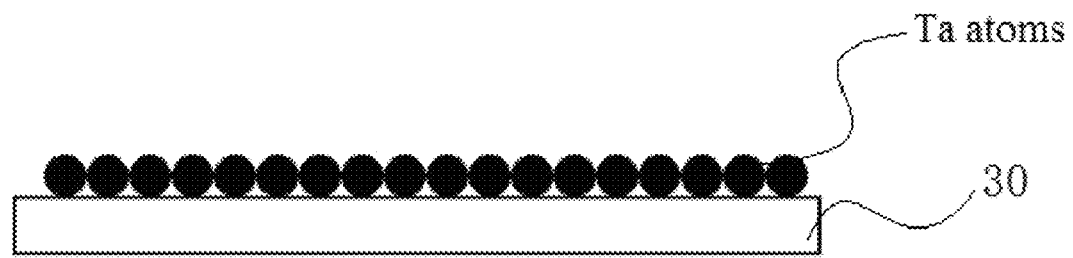

Step 4 (S4), introduce inert gas N$_2$ into the reaction chamber for purge, and heavier Ta atoms are still adsorbed on the substrate surface and lighter gaseous ligands are taken away by N$_2$, thus leaving behind a single layer of Ta atoms on the substrate surface, as shown in FIG. 3d.

Figure 3E:
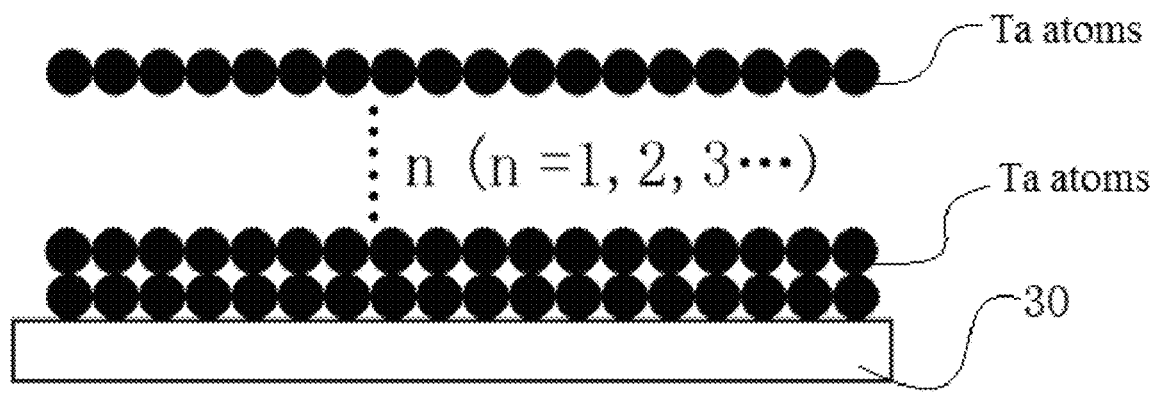

Repeat the steps S1-S4 to n times (n=1, 2, 3, . . . n), so that n layers of Ta atoms are coated on the substrate surface, thus completing the first half reaction of ALD Ta$_x$N$_y$ films, as shown in FIG. 3e.

Figure 4A:
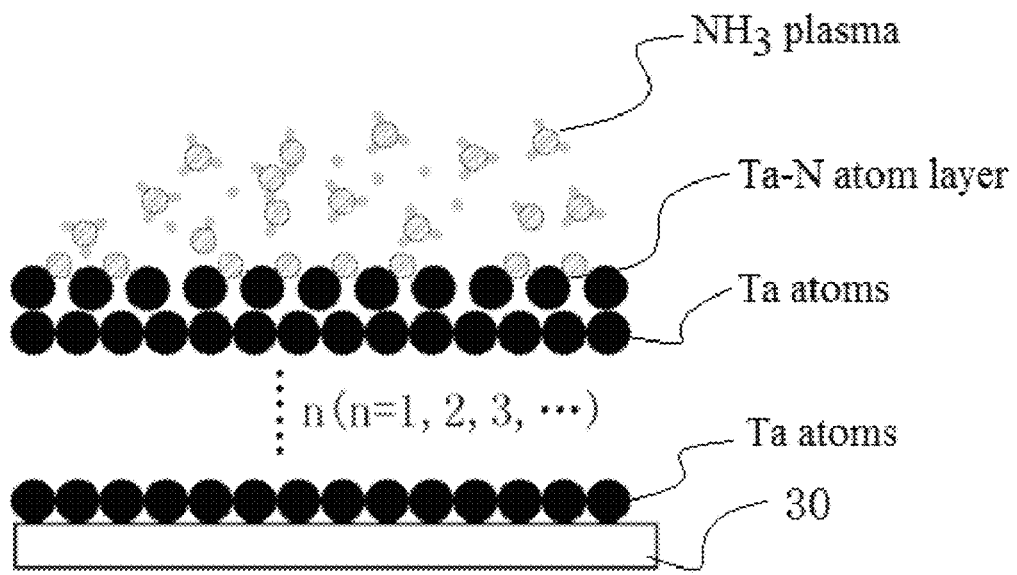
FIGS. 4a-4b are the schematic graphs of the second half reaction process (produce Ta—N atom layers) of ALD Ta$_x$N$_y$ films with the help of a light source.

The second half reaction includes the following steps:

Step 5 (S5), introduce a nitrogen source (NH$_3$) into the reaction chamber and meanwhile switch on the plasma generator to form NH$_3$ plasma. The NH$_3$ plasma is bonded with Ta metal atoms to form a layer of Ta—N on the substrate surface, as shown in FIG. 4a.

Figure 4B:
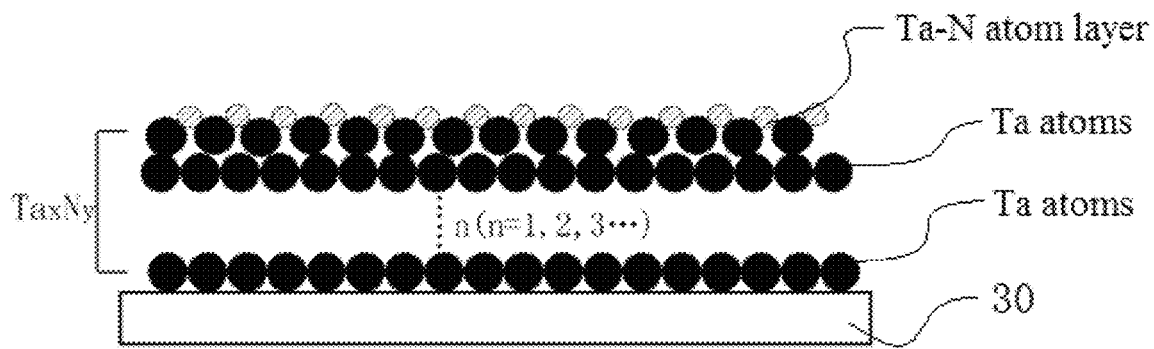

Step 6 (S6), introduce inert N$_2$ into the reaction chamber to take away reaction byproducts and unreacted nitrogen source, leaving behind Ta—N atom layer, as shown in FIG. 4b. As a consequence, a complete reaction cycle of ALD Ta$_x$N$_y$ films is achieved.

Figure 5:
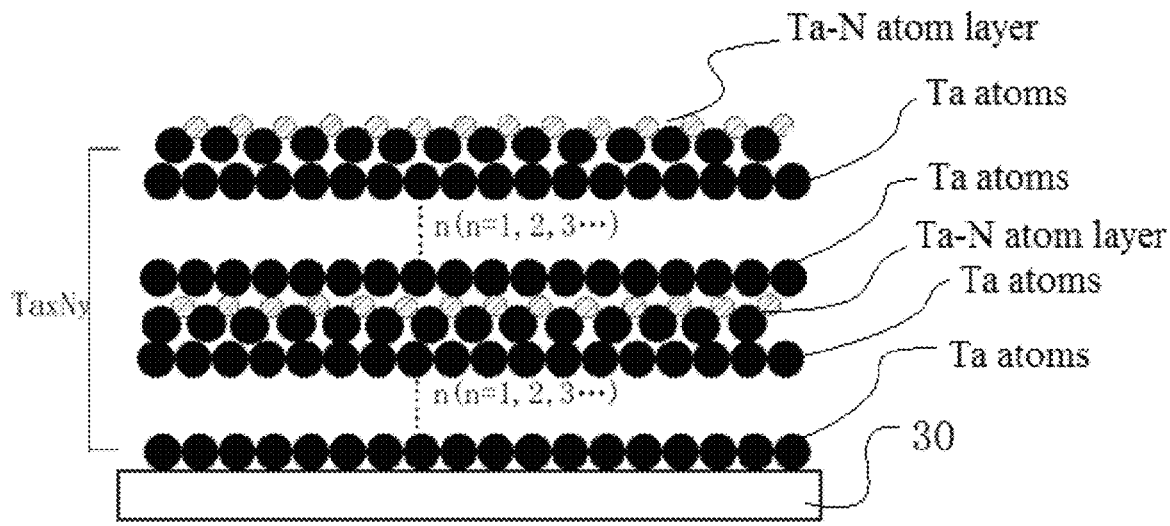
FIG. 5 is the schematic graph of Ta$_x$N$_y$ films with adjustable Ta atom contents (m=1, n≥1).
Figure 6:
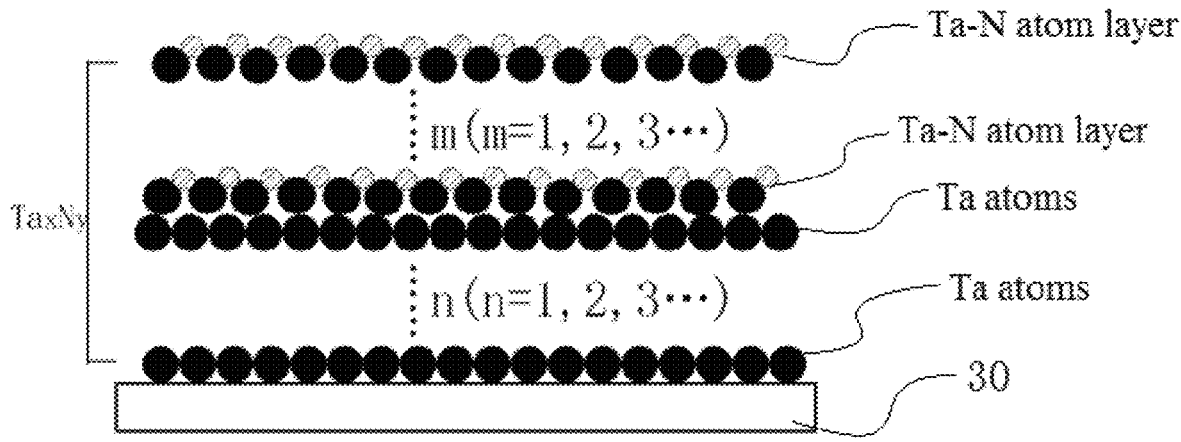
FIG. 6 is the schematic graph of Ta$_x$N$_y$ films formed by alternatively grown Ta and TaN (m≥1, n≥1).

By changing the number of cycles of the first half reaction (steps S1-S4), n, and fixing the number of cycles of the second half reaction, m=1, Ta$_x$N$_y$ films with different content of Ta atoms can be obtained, as shown in FIG. 5. By repeating the steps S1-S6 to m times (m=1, 2, 3, . . . m) and S1-S4 to n times (n=1, 2, 3, . . . n), nanolaminated Ta$_x$N$_y$ films with alternatively grown Ta and TaN can be obtained, as shown in FIG. 6.

In summary, this invention proposes a kind of ALD reactor which introduces a light source to provide extra energy, as well as a method for preparing metal nitride films with adjustable metal contents using this reactor. The metal and nitrogen atom ratio in the metal nitride films grown by the method in accordance with this invention can be modulated, and thereby the film resistivity is adjustable. Light irradiation is introduced to decompose the metal-organic precursors, which will less impurities in the film. This invention is compatible with traditional ALD process, promising to be applicable for Cu interconnect, metal gates and high k dielectrics fields in integrated circuits.

In the above description, the substrate is named as single crystalline silicon. However, metal nitride films can also be deposited on silicon, oxide, nitride, metal, and flexible substrates. The growth method in this invention is described as the preparation of metal nitrides; nevertheless, this invention is also applicable for the growth of metal compound with adjustable metal contents.

Although this invention has been elaborated by the preferred embodiment mentioned above, it is worthy to note that the above description is not a restraint to this invention. After those of ordinary skill in this area have read the above invention, any revision and substitution of this invention is apparent. As a consequence, the protection scope of this invention is defined by the claims.

What is claimed is:

1. A method for depositing metal-nitride thin film with adjustable metal contents, comprising:
    decomposing, by light irradiation, a metal-organic precursor adsorbed on a substrate surface, leaving behind a metal atom layer; and
    reacting a $NH_3$ plasma with the metal atom layer on the substrate surface to form the metal-nitride thin film,
    wherein the decomposing is conducted one or more times prior to the reacting, and
    wherein the decomposing comprises:
        introducing the metal-organic precursor into a reaction chamber with the substrate by way of a pulse, enabling the precursor adsorbed on the substrate surface to react with surface active ligands to saturation;
        introducing a first inert gas into the reaction chamber in order to remove excess metal precursors and reaction byproducts in the reaction chamber;
        switching on a light source to irradiate the substrate and the metal-organic precursor to decompose the metal-organic precursor into metal atoms and gaseous organic ligand molecules, wherein the gaseous organic ligand molecules leave off the substrate surface and the metal atoms are attached on the substrate surface; and
        introducing a second inert gas into the reaction chamber in order to remove gaseous organic ligand molecules.

2. The method for depositing metal-nitride thin film with adjustable metal contents according to claim 1, wherein the metal-organic precursor comprises one or more metals selected from the group consisting of Tantalum, Titanium, Hafnium, Tungsten, and Molybdenum.

3. The method for depositing metal-nitride thin film with adjustable metal contents according to claim 1, wherein the metal-organic precursor is introduced to the substrate surface by atomic layer deposition.

4. The method for depositing metal-nitride thin film with adjustable metal contents according to claim 3, wherein the decomposing and the reacting are conducted in an atomic layer deposition reactor with a light source.

5. The method for depositing metal-nitride thin film with adjustable metal contents according to claim 4, wherein the atomic layer deposition reactor comprises a reaction chamber and the light source, the light source being directed at the reaction chamber.

6. The method for depositing metal-nitride thin film with adjustable metal contents according to claim 1, wherein the reaction chamber is heated to 100-300° C. prior to the introducing of the metal-organic precursor.

7. The method for depositing metal-nitride thin film with adjustable metal contents according to claim 1, wherein the reacting comprises:
    introducing $NH_3$ into a reaction chamber and switching on a plasma generator to produce the $NH_3$ plasma for reacting the $NH_3$ plasma with metal atoms of the metal atom layer on the substrate surface, thus forming metal nitride;
    introducing an inert gas into the reaction chamber in order to remove excess $NH_3$ plasma and reaction byproducts in the reaction chamber.

* * * * *